(12) United States Patent
KarRoy et al.

(10) Patent No.: US 6,459,562 B1
(45) Date of Patent: Oct. 1, 2002

(54) HIGH DENSITY METAL INSULATOR METAL CAPACITORS

(75) Inventors: Arjun KarRoy, Irvine; Klaus Schuegraf, Aliso Viejo, both of CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/863,089

(22) Filed: May 22, 2001

(51) Int. Cl.[7] ................................................. H01G 4/20
(52) U.S. Cl. .................. 361/312; 361/311; 361/306.1; 361/321; 257/295; 257/303
(58) Field of Search ..................... 361/312, 321.1, 361/311, 313, 320, 321, 306.1, 318, 322; 257/295, 303

(56) References Cited

U.S. PATENT DOCUMENTS

| | | | | |
|---|---|---|---|---|
| 4,755,478 A | * | 7/1988 | Abernathey et al. .......... 437/41 |
| 5,046,043 A | * | 9/1991 | Miller et al. ................. 365/145 |
| 5,053,917 A | * | 10/1991 | Miyasaka et al. ........... 361/321 |
| 5,572,052 A | * | 11/1996 | Kashihara et al. .......... 257/295 |
| 6,146,939 A | * | 11/2000 | Dasgupta ..................... 438/251 |
| 6,278,147 B1 | * | 8/2001 | Dalton et al. ................ 257/295 |
| 6,313,516 B1 | * | 11/2001 | Tsui et al. ................... 257/538 |

* cited by examiner

Primary Examiner—Dean A. Reichard
Assistant Examiner—Nguyen Ha
(74) Attorney, Agent, or Firm—Thomas, Kayden, Horstemeyer & Risley, LLP

(57) ABSTRACT

An improved thin-film capacitor and methods for forming the same on a surface of a substrate are disclosed. The capacitor includes a bottom conducting plate formed by depositing conductive material within a trench of an insulating layer and planarizing the conducting and insulating layers. A dielectric film is then deposited on the substrate surface, such that at least a portion of the dielectric material remains over the bottom conducting plate. The dielectric film is formed by depositing a first layer of dielectric and then immersing the top of the first layer of dielectric in gaseous plasmas in a single or a series of steps to change the composition of the first layer of deposited dielectric stack. The additional steps of immersion in a plasma is used to improve the desired performance of the dielectric for capacitor applications such as improved reliability, reduced leakage currents and for tuning voltage coefficients of the capacitor. A second conductive layer is then deposited over the surface of the substrate, patterned and etched such that at least a portion of the second conducting material resides over at least a portion of the dielectric material.

32 Claims, 4 Drawing Sheets

HIGH DENSITY METAL INSULATOR METAL CAPACITORS

FIELD OF THE INVENTION

The present invention relates generally to capacitors in microelectronic devices and, more particularly, to thin-film metal insulator metal capacitors with dielectric material layers.

BACKGROUND OF THE INVENTION

Formation of predictable, reliable capacitors is desirable for several reasons. For example, mixed signal, radio frequency, and other circuits or devices may desirably include integrated capacitors with predictable and reliable electrical characteristics. In particular, these devices include capacitors with low voltage coefficients (the change of capacitance with voltage over an operating range), good capacitor matching, and relatively predictable capacitor values. In addition, if capacitors form part of an integrated circuit, it may be desirable to minimize additional processes or changes to processes required to form the capacitor. Accordingly, it is often desirable to form such capacitors using substantially standard semiconductor process flows such as CMOS, bipolar, and BiCMOS processes.

Capacitors for microelectronic devices may be formed in a variety of configurations. Often, such capacitors include two substantially parallel layers of conductive material separated by an insulating layer. Conductive materials typically include doped silicon substrate, polysilicon, or metal and insulating materials typically include a dielectric material such as silicon oxide, silicon nitride, silicon oxynitride, tantalum oxide, aluminum oxide, barium strontium titanate, or other insulating materials.

The thin-film capacitor is generally formed by depositing, patterning, and etching various layers on a substrate. Typically, a first parallel layer of conductive material (a base plate) is formed by depositing the conductive material over the surface of the substrate, wherein the substrate may be a semiconductor wafer with several layers of conducting, insulating, semiconducting and semi-insulating layers thereon. Alternatively, the conductive material may be formed by doping the semiconductor substrate with substantially conductive material.

If the base plate is formed by depositing conductive material on the wafer surface, the material may be patterned with photoresist and etched using an appropriate wet or dry etch process. Similarly, and regardless of how the base plate was formed, the insulating layer may be formed by depositing insulating material over the surface of the wafer, patterning the insulating material, and etching the insulating material leaving at least some insulating material over at least a portion of the conducting layer. A second conducting layer (top plate of the capacitor) may be formed over the insulating layer in a like manner.

Typical capacitor materials and configurations of top and base capacitor plates generally include: a polysilicon top plate and a doped substrate base plate, a polysilicon top plate and a polysilicon base plate, metal top plate and a polysilicon base plate, or metal top plate and a metal base plate. Of these various capacitor configurations, such metal insulator metal (MIM) capacitors may be particularly advantageous because, among other reasons, they allow for increased distance from the substrate to the bottom plate, and they generally have lower voltage coefficients due to reduced voltage induced depletion effects at the metal to dielectric interface.

In an effort to reduce device and circuit costs, it is generally preferred to reduce the size of the devices and circuits and their corresponding capacitors. Capacitor size, for a given capacitance, may be reduced by increasing the capacitor's capacitance density. The increase in capacitance density can be achieved by using insulating layers with higher dielectric constant, by reducing the thickness of the insulating layer, or any combination thereof. However, as capacitance density increases, likewise, the voltage coefficient tends to increase as well. Currently, the industry standard for MIM capacitor density is about 1 to 1.5 $fF/\mu m^2$.

Further, integration of MIM capacitors is typically done in upper metallization levels. Such integration places a limit on the deposition temperature to 400° C. or less because of the instability of the materials commonly used (e.g., aluminum, low-k dielectrics, and the like). However, dielectrics formed at such temperatures may have pinhole defects and charge traps, thereby resulting in dielectrics with higher leakage currents than dielectrics deposited at higher temperatures.

Still further, a preferred distance between conducting layers for a given dielectric material is often governed by voltage breakdown design parameters (leakage current). Breakdown voltage parameters are generally dependent upon, among other things, the minimum distance between conducting layers (corresponding to the thickness of the dielectric layer). This dielectric thickness is limited by the minimum allowable thickness to achieve manufacturability to target specifications of mean deposition thickness and uniformity. However, such low thicknesses may create increased leakage problems due to trapped charges and pinhole defects.

If either the insulating layer or the conducting layers, or a combination of the same have rough surfaces, the insulating layer thickness may have to be increased to compensate for the thinner regions of the layer such that the thinnest portion of the insulating layer provides adequate (e.g., sufficiently high) breakdown voltage characteristics. However, again, as low temperature oxide dielectric thickness gravitates towards thinner films, the leakage current generally increases.

For example, generally, nitride films tend to be leakier. In order to lower such leakage, composite stacks of typical films might be used. Unfortunately, however, film thickness becomes more difficult to control as the individual film thicknesses of the composite stack themselves become thinner. That is, using current industry standard equipment, film thickness variability and uniformity become more difficult to control as the films themselves become thinner.

Lastly, the capacitors formed as described above are often placed in a post anneal furnace (typically greater than 600° C.) for several hours in an oxygen rich or nitrogen rich environment in order to help fill up of the charge traps and improve film density. However, as mentioned above, MIM capacitors have restrictions of processing temperature to be less than 400° C. and, as such, high temperatures generally may not be used.

In order to overcome these high current leakage difficulties, alternative dielectric materials having higher dielectric constants have been substituted. Generally, these alternative materials include, for example, silicon nitride. However, such low temperature nitride films still tend to have higher leakage currents due to higher trapped charge densities Thus, there exists a need for improved thin-film capacitors and for methods of forming the capacitors.

SUMMARY OF THE INVENTION

The present invention provides improved thin-film MIM capacitors and methods for forming the same. While the way in which the present invention addresses the various disadvantages of presently known capacitors will be addressed hereinbelow, in general, the invention provides a capacitor that is more reliable. In addition, the capacitor of the present invention may be formed with minimal additional processing steps.

In accordance with one embodiment of the present invention, a capacitor formed with alternating dielectric stacks is provided. For example, in accordance with one exemplary embodiment, a dielectric stack, such as a nitride stack is deposited in a plasma enhanced chemical vapor deposition process (PECVD) or a high density plasma (HDP) PECVD process. Next, reoxidation of the nitride stack is performed by immersion in an oxygen rich plasma in a HDP PECVD chamber, thereby forming an oxide rich stack on the top surface of the first nitride stack (an N-O configuration). In accordance with another aspect of the present invention, after adding the oxide stack, a second nitride stack may be formed over the oxide stack by subsequent immersion in a nitrogen rich plasma (N-O-N configuration).

In accordance with another aspect of the present invention, the process of applying the alternating dielectric stacks may be simplified by performing the entire process in one chamber. For example, the nitride stack may be suitably applied in an HDP chamber. After the nitride stack is applied, the same chamber can be used to reoxidize the nitride stack to form an oxide stack.

In accordance with another aspect of the present invention, additional alternating stacks may be added depending on the particular application of capacitor. For example, the stacks may be suitably formed in any configuration, such as O-N-O, O-N-O-N, N-O-N-O configurations and the like.

BRIEF DESCRIPTION OF THE DRAWINGS

A more complete understanding of the present invention may be derived by referring to the detailed description and claims when considered in connection with the drawing figures, wherein like reference numbers refer to similar elements throughout the figures, and:

DETAILED DESCRIPTION

The following descriptions are of exemplary embodiments of the invention only, and are not intended to limit the scope, applicability or configuration of the invention in any way. Rather, the following description is intended to provide convenient illustrations for implementing various embodiments of the invention. As will become apparent, various changes may be made in the function and arrangement of the elements described in these embodiments without departing from the sprit and scope of the invention.

The present invention generally relates to capacitors formed on a substrate surface and to methods for forming the capacitors. More particularly, the invention relates to forming thin-film MIM capacitors having alternating dielectric stacks on a substrate surface by depositing a first layer of dielectric and then immersing a top surface of the first layer of dielectric in gaseous plasmas in a single or a series of steps to change the composition of the first layer of deposited dielectric stack. While the thin-film capacitors of the present invention may be formed on the surface of any substrate, the present invention is conveniently described in connection with the surface of a semiconductor wafer, wherein the wafer may have several layers of conducting, insulating, semi-conducting and semi-insulating layers deposited and patterned thereon. Further, during formation of the capacitor or other microelectronic devices on a semiconductor surface, the surface of the wafer may change from step to step in the fabrication process. Therefore, as used below, the term surface generally means the top of the semiconductor wafer, and may not necessarily refer to any particular, substrate, material, film or device structure.

Figure 1:
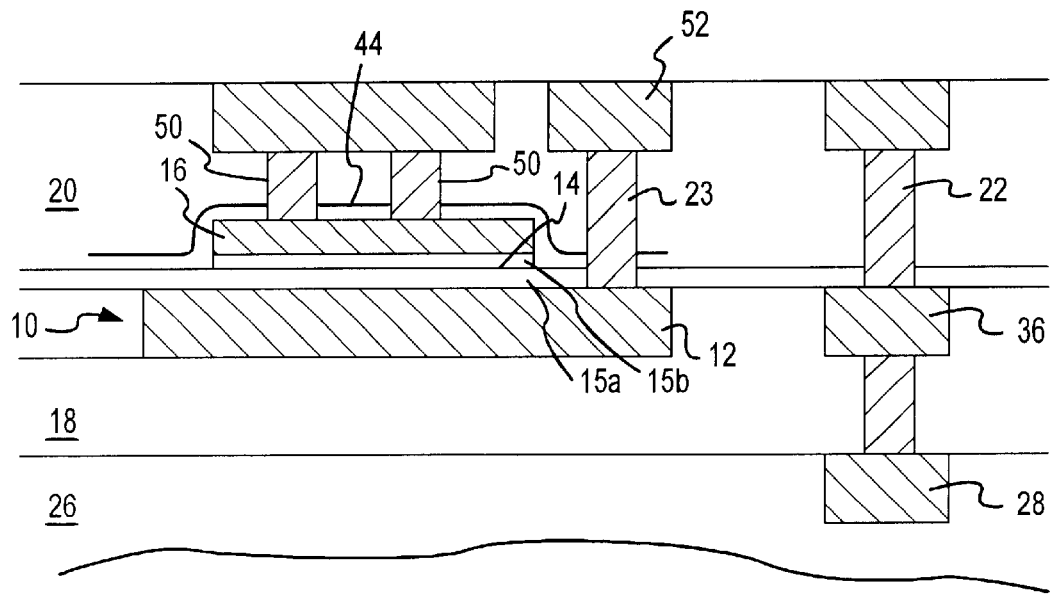
FIG. 1 is a schematic cross-sectional diagram of a semiconductor wafer including a thin-film capacitor in accordance with the present invention.

A thin-film capacitor 10 in accordance with the present invention is shown in FIG. 1. Thin-film capacitor 10 generally includes a base plate 12, a dielectric layer 14 with a thickness in the range of 100 Å to 900 Å and a top plate 16. Thin-film capacitor 10 is typically surrounded by insulating layers 18 and 20, and electrical plugs 22 are typically used to form electrical contacts to various components on the wafer.

In accordance with various embodiments of the present invention, methods of forming capacitor 10 and other features on the wafer suitably require few additional steps (e.g., deposition, masking, and etching steps) that are specific to capacitor 10 formation. In addition, preferable embodiments are generally configured such that capacitor 10 may be formed at various metallization levels. Accordingly, the capacitors and methods described below are designed to be substantially robust such that they may be formed or implemented at various metallization levels on the wafer surface.

With reference to FIGS. 2–7, thin-film capacitor 10 may be formed on a surface 24 of a semiconductor wafer. Surface 24 may include any material and preferably includes an insulating film 26 and a conductive feature 28. Insulating film 26 may include any material that is resistant to the conduction of electricity. Such materials may include doped or undoped silicon oxide, phosphosilicate glass, tetraethylorthosilane (undoped or doped with boron and/or phosphorous), low-k dielectric materials such as spin on dielectrics, fluorinated oxides, or the like. Conducting feature 28 may include any material capable of conducting electricity such as, for example, polysilicon, doped polysilicon, tungsten, aluminum, copper, titanium nitride, any combination thereof, or the like.

In one embodiment of the invention, base plate 12 is generally formed within insulating layer 18 using, for example, damascene processing, which includes forming a trench or the like, filling the trench with material, and removing any excess material from the surface. Of course, alternative processing methods known to those skilled in the art for manufacturing integrated MIM capacitors, for example, an aluminum subtractive etch process, may likewise be employed. Accordingly, capacitor 10 formation generally begins with depositing insulating layer 18 onto surface 24 of the wafer. Insulating material 18 may include any material that is resistant to conduction of electricity. Insulating material 18 may include an oxide, a doped oxide, a low-k dielectric material, any combinations thereof, or the like. For example, insulating material 18 may include silicon oxide. In one embodiment, insulating material 18 is planarized using any conventional CMP to provide a smooth surface for subsequent processing. As discussed in greater detail hereinbelow, planarizing a surface suitably facilitates relatively precise transfer of a pattern onto a surface.

Figure 2:
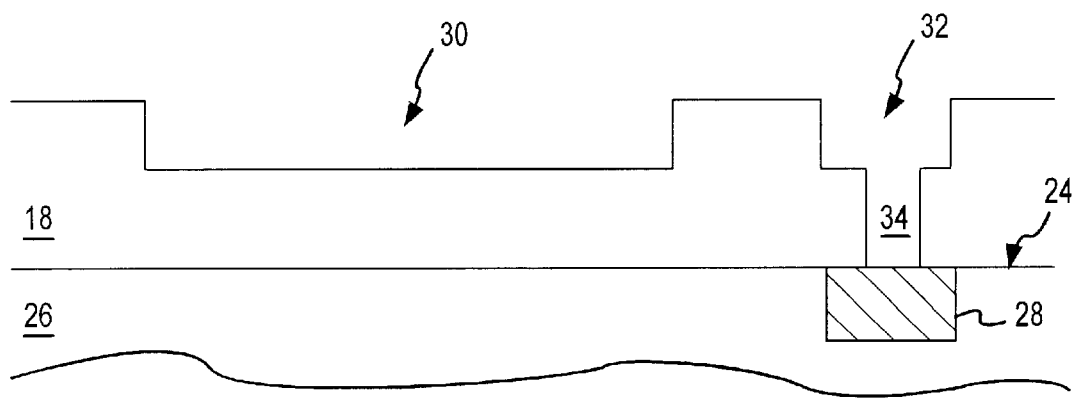
FIG. 2 is a schematic cross-sectional diagram of a wafer showing trenches and vias formed within an insulating layer.

Referring now to FIG. 2, insulating layer 18 may be patterned and etched to form trenches 30, 32 and a via 34. Trenches 30, 32 and via 34 may be formed by any suitable methods known in the art, such as, for example, by patterning the surface of material 18 with an etch-resistant substance and exposing portions of material 18 to an etchant. In accordance with various aspects of the present invention, trenches 30, 32 and via 34 may be formed with the same or distinct masking and etching steps; however, trenches 30, 32 and via 34 are preferably formed during separate steps.

Figure 3:
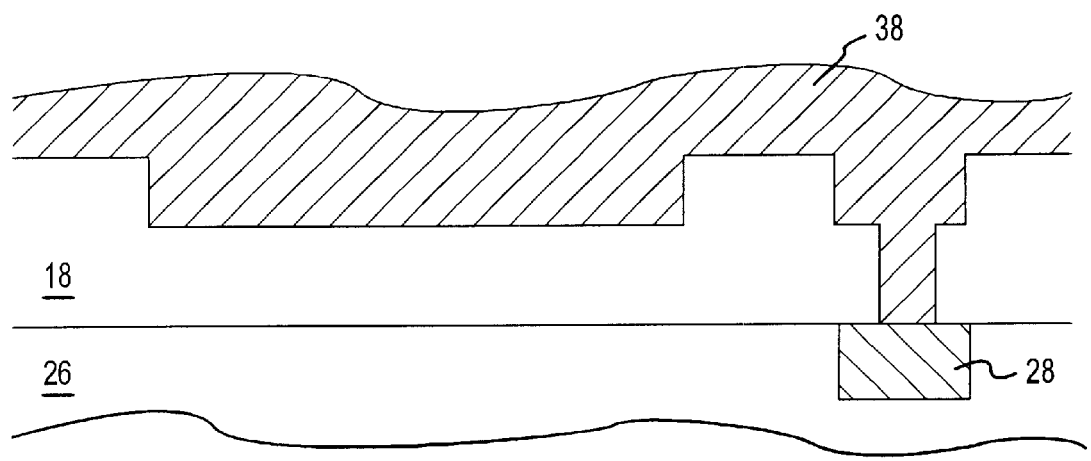
FIG. 3 is a schematic cross-sectional diagram of the wafer shown in FIG. 2 with conductive material deposited over the surface of the wafer.
Figure 4:
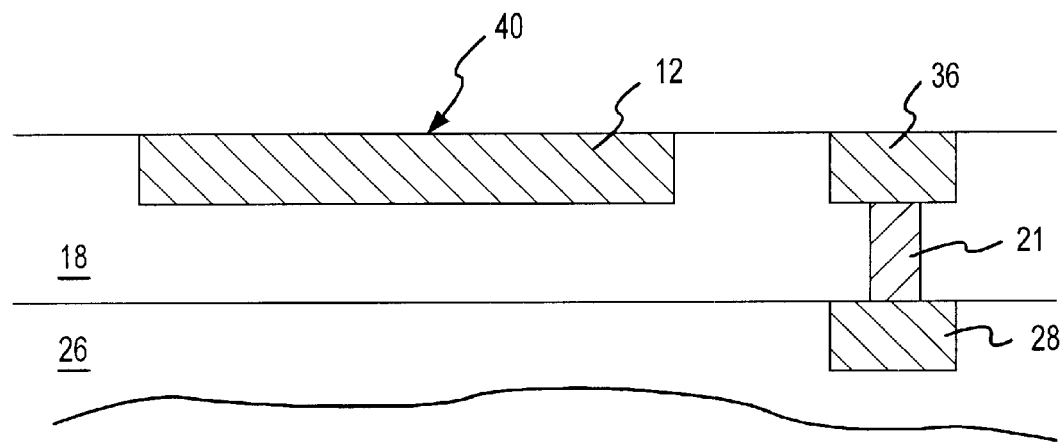
FIG. 4 is a schematic cross-sectional diagram of the wafer shown in FIG. 3 after the conductive material has been removed from a portion of the wafer surface.

Referring particularly to FIGS. 3 and 4, base plate 12 of capacitor 10 and a conductive line 36 may be formed by depositing a conducting material 38 over the surface of insulating layer 18. Conducting material 38 may include any material that allows conduction of electricity. In embodiments of the present invention, conducting materials may include metals such as copper, tungsten, aluminum, tungsten nitride or titanium nitride. In accordance with various embodiments of the present invention, conducting material 38 includes a barrier metal of about 0 to about 1000 Å of titanium nitride, titanium, tantalum, tantalum nitride, combinations thereof, or the like and about 1000 Å to about 10000 Å of copper, aluminum, or tungsten.

In accordance with an aspect of this embodiment, base plate 12 may be conditioned to prevent dielectric layer-conducting layer interface degradation. Conditioning techniques may include a sputter clean, passivation anneals in atmospheres of oxygen, nitrogen, hydrogen, other gases, and combinations thereof In addition, a dielectric diffusion barrier film 44 having a thickness of about 50 Å to about 500 Å may be deposited onto surface 40. In such cases, additional masking and etching steps may consequently be necessary to remove the barrier film 44 from material 18 surface to prevent shorts between the base plate 12 and feature 36 and the like.

Referring now to FIG. 4, base plate 12 and feature 36 are defined by removing a portion of conducting material 38 such that the top of conducting material 38 is substantially in the same plane as the top of insulating layer 18. Optionally, the portion of conducting material 38 is removed using CMP. Using CMP to remove a portion of conducting material 38 is advantageous for capacitor formation because, among other reasons, it provides a smooth top surface 40 of base plate 12 for improved capacitor 10 performance.

Figure 5:
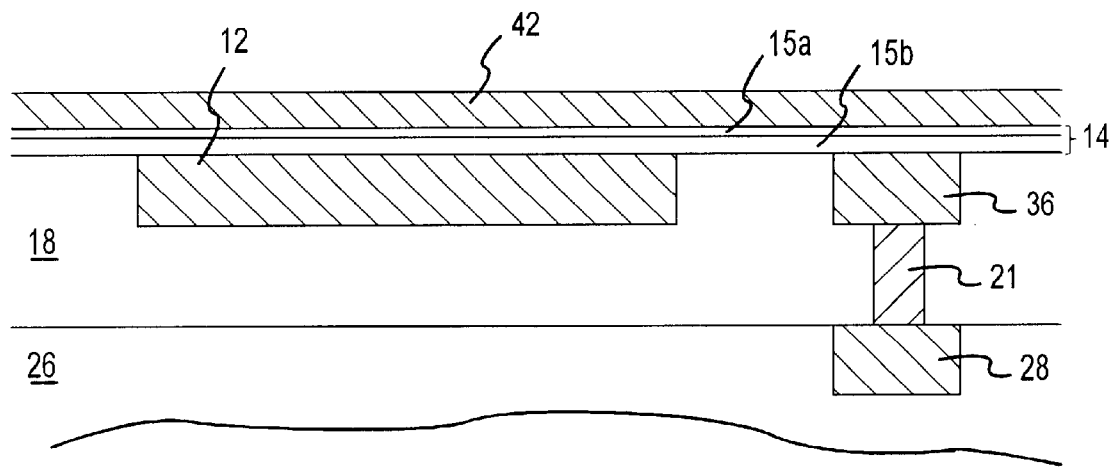
FIG. 5 is a schematic cross-sectional representation of the wafer shown in FIG. 4 with a dielectric film and a conductive material deposited on the wafer surface.

Referring back to FIG. 1 and additionally, to FIG. 5, in accordance with the present invention, an alternating nitride-oxide (N-O) stack is formed by performing one deposition step to form a nitride stack and a subsequent treatment in an oxygen rich plasma to form an oxide stack. That is, dielectric layer 14 of capacitor 10 is formed with alternating layers (stacks) of dielectric materials over the surface of the wafer. Dielectric layer 14 may be formed using any material that is partially or wholly resistant to the conduction of electricity. In one embodiment, material used to form dielectric layer 14 also has a high dielectric constant such as silicon nitride, silicon oxynitride, silicon oxide, tantalum pentoxide and the like. As an example, a silicon nitride stack 15a of about 100 Å to 300 Å is deposited over the surface of the wafer using conventional dielectric deposition means.

For example, in one embodiment of the invention, nitride stack 15a may be deposited in a plasma enhanced chemical vapor deposition process (PECVD) or a high density plasma (HDP) PECVD process. Next, reoxidation of the nitride stack 15a is suitably performed, thereby forming an oxide stack 15b on top of the nitride stack 15a.

In accordance with various aspects of the present invention, nitride stack 15a may be deposited in one chamber and the reoxidation by immersion in an oxygen rich plasma for forming oxide stack 15b can be performed in a separate chamber. However, alternatively, nitride stack 15a may be deposited and followed by oxidation in the same chamber by introducing the oxidizing gas in a subsequent step in the same chamber. Alternatively other gases may likewise be substituted, such as, for example, argon, helium, nitrogen, NO, $N_2O$, $NH_3$, $H_2$ and the like. In accordance with another aspect of the present invention, the process of applying the alternating dielectric stacks 15a,b,c may be simplified by performing the entire process in one chamber. For example, nitride stack 15a may be suitably applied in an HDP chamber. After stack 15a is applied, the same chamber can be used to reoxidize stack 15a to form oxide stack 15b.

In one embodiment of the invention, reoxidation is performed by immersion in an ambient of plasma with oxygen rich species to form an oxide or oxygen rich layer on the top surface of the stack 15a. The properties and thickness of this second stack 15b may be controlled by the time, pressure, applied RF power and the species gases forming the plasma. For example, the stack thickness may be controlled by the plasma generator type, the ionizing gas concentration, the power applied or other suitable techniques, such as, enhancing the reoxidation using ion bombardment with gases such as argon. HDP PECVD equipment thus facilitates more efficient plasma immersion.

Thus, for the MIM capacitor of the present invention, if top plate 16 is put on top of stack 15b, instead of directly on top of stack 15a without the reoxidation, the voltage coefficients of the capacitors change due to differences in charged traps, bandgap and interface surface change. The voltage coefficients improve in a reoxidized nitride film MIM capacitor versus pure nitride film MIM capacitor of the present invention at higher densities resulting in thinner nitride deposition thickness with comparable capacitor densities. For example, MIM capacitor densities in the range of about 1.0 to 8fF/$\mu m^2$ may be obtained. Additionally, these processes, in accordance with one aspect of the present invention, are performed at temperatures less than about 420° C., thus maintaining the manufacture of the MIM capacitor within industry maximums.

Further, such reoxidation suitably reduces pinhole defects and tunneling, e.g., charge traps, thereby reducing leakage currents and increasing the reliability of the capacitor. The additional reliability margin allows thinner dielectric stacks to be deposited, thus increasing the capacitance density. Further, the thickness of the layer 15b may be substantially thinner, but be sufficient to provide adequate pinhole defect reduction and/or alter the voltage coefficients favorably.

Figure 6:
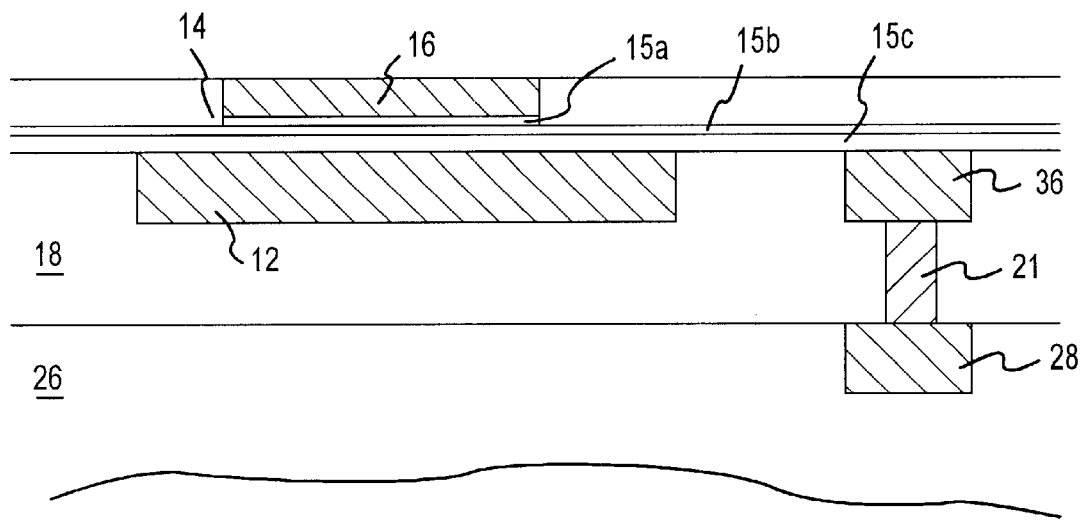
FIG. 6 is a schematic cross-sectional diagram of the wafer shown in FIG. 5 with a top plate of a capacitor formed on the surface of the wafer.
Figure 7:
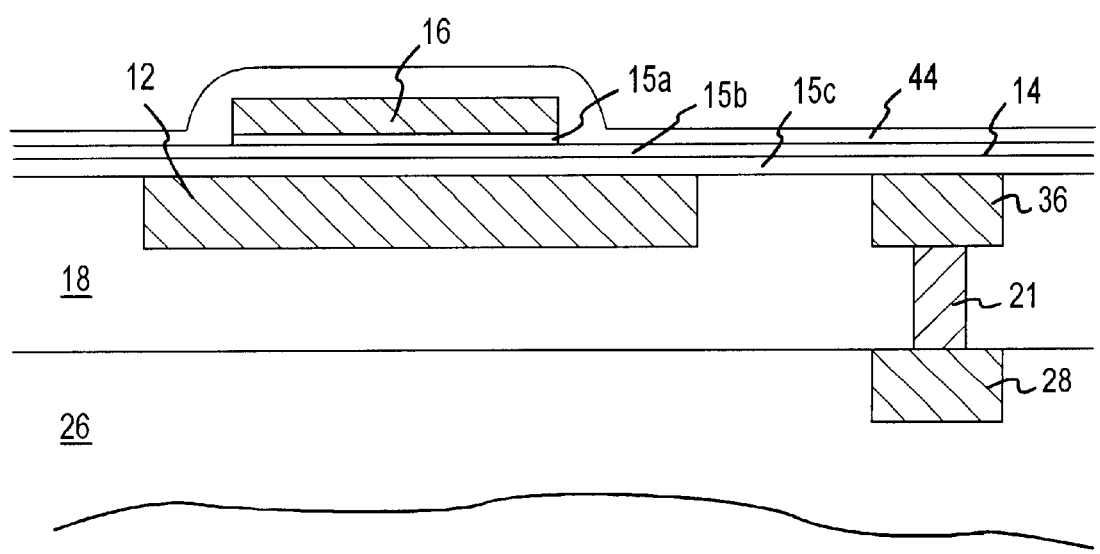
FIG. 7 is a schematic cross-sectional diagram of the wafer shown in FIG. 6 with a second dielectric film deposited on top of the wafer.

In accordance with various alternative aspects of the present invention, and with reference now to FIGS. 6–7, various numbers of stacks 15a,b and materials used in forming stacks 15a,b may be used. For example, after forming an oxide stack 15b, a second nitride stack 15c, is then formed over oxide stack 15b. Again, nitride stack 15c may be formed by subsequent immersion in a nitrogen rich plasma in a PECVD or HDP PECVD chamber. By controlling deposition conditions, the thickness of layer 15c can be made shallower than the thickness of layer 15b. Conditions can be set so that the nitridation thickness is less than the oxidation thickness in the prior step to form a N-O-N stack.

In still another embodiment, nitride stack 15a,c can be further exposed to nitrogen plasma to perform additional nitridation and help reduce trapped charges and heal pinhole defects. Similarly, oxide stack 15b can be further exposed to oxygen plasma to perform additional oxidation to help reduce trapped charges and heal any pinhole defects In accordance with yet another alternative aspect of the present invention, the method of forming second stack 15b can be used such that the penetration depth of the plasma gas is thicker than the film itself. In such case, the top surface of the bottom electrode is also treated by the oxidizing gas. This increased depth may again change the metal-dielectric interface to change the bandgap or change surface charge densities and improve upon capacitor parameters such as leakage, linearity and reliability. For example, oxide stack 15b may be within a range of about 100 Å–300 Å. This may then be followed by nitridation of the entire film and/or the underlying electrode to further improve the properties of capacitor 10.

Of course, one skilled in the art will recognize that any process which allows for multiple alternating stacks of dielectric material may be used. Further, though previously described embodiments use N-O-N stacks, it should be appreciated, that additional alternating stacks may be added depending on the particular application of capacitor 10. For example, the stacks may be suitably formed in O-N-O, O-N-O-N, N-O-N-O configurations and the like.

The particular thickness of dielectric layer 14 may depend on a particular application of capacitor 10, upon desired capacitor characteristics, and the like. However, in one embodiment of the present invention, dielectric layer 14 is preferably within a range of about 100 Å–900 Å thick, while each stack 15a,b,c is preferably about 50 Å–250 Å, 10 Å–150 Å, and 10 Å–100 Å thick, respectively.

With continued reference to FIG. 5, a conductive material 42 is deposited over the surface of dielectric layer 14. Conductive material 42 includes films comprising: titanium nitride, aluminum, titanium nitride/titanium/titanium nitride, titanium nitride/tungsten, tantalum nitride/copper, combinations thereof and the like, with thicknesses ranging from about 100 to about 3000 Å.

Top plate 16 formation includes patterning a substantially planar surface. Patterning over a substantially planar surface (i. e., a surface that is substantially devoid of topography) allows substantially true pattern translation. For example, when a mask and photoresist are used to pattern the surface, translation of the defined pattern from the mask onto the wafer may be substantially true if the surface is substantially planar. Moreover, during subsequent capacitor top plate 16 formation, the photoresist pattern can be substantially accurately transferred to material 42 for substantially accurate definition of top plate 16, particularly if material 42 is sufficiently thin, for example, less than about 2000 Å.. Sufficiently thin top plate 16 results in reduced localized etch profile variations, such as, for example, reactive ion etching lag, pattern dependent profile microloading, and the like, as well as reduced across-wafer material 14 film-thickness variations due to material 42 etch and over etch processes.

With reference now to FIG. 6, top plate 16 of capacitor 10 may be formed over dielectric layer 14 in a variety of ways. Top plate 16 may be formed by coating material 42 with photoresist, patterning the photoresist, developing the photoresist, and etching material 42 to form top plate 16. Dielectric material 14 acts as an etch stop layer for material 42 etch such that material 42 etchants do not react with material 12, 18 and the like. In particular, the composition and thickness of the layers 15a, 15b, 15c may be adjusted to provide an improved etch stop layer during etching of layer 42. For example, if top plate 16 is composed of titanium, aluminum, titanium nitride, tantalum nitride or the like, a common etchant gas used is chlorine. Silicon oxide etches more slowly than silicon nitride in chlorine gas and as such silicon oxide can provide better etch stop capability. The thickness of the silicon oxide layer formed on silicon nitride in the dielectric stack 14 may be optimized to provide adequate etch stop selectivity while patterning layer 42 to form top plate 16.

With reference now to FIG. 7, in accordance with another aspect of the present invention, a silicon nitride copper diffusion barrier film 44 may be deposited onto the wafer surface. In one example, about 500 Å of the diffusion barrier film 44 is deposited onto the wafer surface.

Any number of conducting, semi-conducting, semi-insulating or insulating films may be added to the surface of the wafer after capacitor 10 is formed. For example, as shown in FIG. 1, insulating layer 20 may be deposited onto the surface and subsequently planarized using CMP. Conductive plugs 50 and lines 52 may be formed in accordance with the damascene methods described above. The etchant used during damascene processing to remove material 20 etches material 20 at a rate greater than it etches plate 16 material, so that the etch does not punch through top plate 16 and attack dielectric 14, or to base plate 12 to create unwanted capacitor shorts. The surface of layer 20 may then be planarized to form the structure shown in FIG. 1.

Methods for forming capacitors 10 and the like are preferably chosen such that, if possible, minimal additional or new process steps are required to form the capacitors. Accordingly, the process flow sequence described for forming the structure shown in FIG. 1, including capacitor 10, preferably requires only a single additional patterning step in addition to typical damascene interconnect processes. The addition of only one additional masking step makes the formation of capacitor 10 relatively simple and inexpensive.

The terms top and bottom have been used throughout this application to refer to various layers, plates and surfaces. These terms are used for reference to the drawing figures only and are not meant to limit possible configuration of capacitors described hereinabove. In addition, although the present invention is set forth herein in the context of the appended drawing figures, it should be appreciated that the invention is not limited to the specific forms shown. Various other modifications, variations and enhancements in the design and arrangement of the thin-film capacitors as set forth herein may be made without departing from the spirit and scope of the present invention as set forth in the appended claims. For example, various feature or devices such as conductive lines, resistors, and the like may be formed on a surface of a wafer during capacitor formation.

What is claimed is:

1. A thin-film capacitor comprising:
    a first insulating layer having a bottom plate of a capacitor and a conductive feature formed therein;

a second insulating layer having a top plate of a capacitor and a conductive feature formed therein, wherein said conductive feature is in electrical contact with said bottom plate; and a dielectric layer interposed between said first and second insulating layers, where said dielectric layer is comprised of at least one stack comprising multiple dielectric materials, said stack being formed by depositing a first dielectric layer and immersing said first dielectric layer in a gaseous plasma to change the composition of a top portion of said first dielectric layer.

2. The capacitor of claim 1, wherein said first dielectric layer is immersed in said gaseous plasma until the composition of substantially all of said first dielectric layer is changed.

3. The capacitor of claim 1, wherein said first dielectric layer is immersed in said gaseous plasma until the composition of all of said first dielectric layer and a portion of said bottom plate is changed.

4. The capacitor of claim 1, wherein said stacks comprise a first stack and a second stack, said second stack being formed by immersing said first stack in a first gaseous plasma.

5. The capacitor of claim 4, wherein said dielectric layer is about 100 Å to 900 Å thick.

6. The capacitor of claim 4 wherein said first stack is about 50 Å to 300 Å thick and said second stack is about 10 Å to 200 Å thick.

7. The capacitor of claim 4 wherein said first stack is a nitride stack and said second stack is an oxide stack.

8. The capacitor of claim 7 wherein said nitride stack is formed by immersion in a nitrogen rich plasma and said oxide stack is formed by immersion in an oxygen rich plasma.

9. The capacitor of claim 1, wherein said stacks comprise a first stack, a second stack and a third stack, said second stack being formed by immersing said first stack in a first gaseous plasma, and said third stack being formed by immersing said first and said second stack in a second gaseous plasma.

10. The capacitor of claim 9, wherein said first stack is about 50 Å to 300 Å thick, said second stack is about 10 Å to 200 Å thick and said third stack is about 10 Å to 100 Å thick.

11. The capacitor of claim 9, wherein said first stack is a nitride stack, said second stack is an oxide stack and said third stack is a nitride stack.

12. The capacitor of claim 10, wherein said third stack is formed by immersion in a nitrogen rich plasma and said second stack is formed by immersion in an oxygen rich plasma.

13. The capacitor of claim 1, further comprising a dielectric diffusion barrier film covering the capacitor.

14. A method of forming a thin-film capacitor comprising:

providing a first insulating layer having a bottom plate of a capacitor and a conductive feature formed therein;

providing a second insulating layer having a top plate of a capacitor and a conductive feature formed therein, wherein said conductive feature is in electrical contact with said bottom plate;

interposing a dielectric layer between said first and second insulating layers by depositing a first dielectric layer and immersing said first dielectric layer in a gaseous plasma to change the composition of a top portion of said first dielectric layer.

15. The method of claim 14, further comprising the step of conditioning the surface states of at least one of said bottom plate and said top plate before dielectric deposition.

16. The method of claim 15, wherein said conditioning step is done with a sputter clean process.

17. The method of claim 15, wherein said conditioning step is done through passivation anneals.

18. The method of claim 14, further comprising the step of applying a barrier film coating the capacitor.

19. The method of claim 14, wherein said first dielectric layer is immersed in said gaseous plasma until the composition of substantially all of said first dielectric layer is changed.

20. The method of claim 14, wherein said first dielectric layer is immersed in said gaseous plasma until the composition of all of said first dielectric layer and a portion of said bottom plate is changed.

21. The method of claim 14, wherein said dielectric layer comprises a first stack and a second stack, said second stack being formed by immersing said first stack in a first gaseous plasma.

22. The method of claim 21, wherein said dielectric layer is about 100 Å to 900 Å thick.

23. The method of claim 21, wherein said first stack is about 50 Å to 300 Å thick and said second stack is about 10 Å to 200 Å thick.

24. The method of claim 21, wherein said first stack is a nitride stack and said second stack is an oxide stack.

25. The method of claim 24, wherein said nitride stack is formed by immersion in a nitrogen rich plasma said oxide stack is formed by immersion in an oxygen rich plasma.

26. The method of claim 14, wherein said dielectric layer comprises a first stack, a second stack and a third stack, said second stack being formed by immersing said first stack in a first gaseous plasma, and said third stack being formed by immersing said first and said second stack in a second gaseous plasma.

27. The method of claim 26, wherein said first stack is about 50 Å to 300 Å thick, said second stack is about 10 Å to 200 Å thick and said third stack is about 10 Å to 100 Å thick.

28. The method of claim 26, wherein said first stack is a nitride stack, said second stack is an oxide stack and said third stack is a nitride stack.

29. The method of claim 28, wherein said first stack and said third stack are formed by immersion in a nitrogen rich plasma and said second stack is formed by immersion in an oxygen rich plasma.

30. The method of claim 21, wherein said first stack is formed in a process chamber by deposition through a PECVD process and said second stack is formed by immersing said first stack in said first gaseous plasma in said process chamber.

31. The method of claim 26, wherein the first stack is formed in a process chamber by deposition through a PECVD process, said second stack is formed by immersing said first stack in said gaseous plasma in said process chamber and said third stack is formed by immersing said second stack in said second gaseous plasma in said process chamber.

32. The method of claim 30, wherein said PECVD process is a high density plasma PECVD process.

* * * * *